US009829785B2

United States Patent
Lu et al.

(10) Patent No.: US 9,829,785 B2
(45) Date of Patent: *Nov. 28, 2017

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsinchu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 879 days.

This patent is subject to a terminal disclaimer.

(21) Appl. No.: 14/106,376

(22) Filed: Dec. 13, 2013

(65) Prior Publication Data

US 2015/0168845 A1    Jun. 18, 2015

(51) Int. Cl.
*G03F 7/20* (2006.01)
*G03F 1/22* (2012.01)

(52) U.S. Cl.
CPC ............ *G03F 1/22* (2013.01); *G03F 7/70441* (2013.01)

(58) Field of Classification Search
CPC ............ G03F 7/7015; G03F 1/22; G03F 7/20
USPC ................................................ 335/71; 430/5
See application file for complete search history.

(56) References Cited

U.S. PATENT DOCUMENTS

| 4,947,413 A | 8/1990 | Jewell et al. | |
| 9,529,272 B2* | 12/2016 | Lu | G03F 1/22 |
| 2002/0187406 A1* | 12/2002 | Magome | G03F 1/78 |
| | | | 430/5 |

OTHER PUBLICATIONS

Christopher N. Anderson et al., "The SEMATECH Berkeley MET: Extending EUV Learning to 16-nm half pitch," Proc. of SPIE vol. 7969 7969OR, pp. 6.

* cited by examiner

*Primary Examiner* — Steven H Whitesell Gordon
*Assistant Examiner* — Jerry Brooks
(74) *Attorney, Agent, or Firm* — Haynes and Boone, LLP

(57) ABSTRACT

An extreme ultraviolet lithography (EUVL) system for patterning a semiconductor wafer includes an extreme ultraviolet (EUV) mask. The EUV mask includes first and second states, and further includes a polygon region and an open-spacing region. The polygon region includes a plurality of main polygons separated by a plurality of first fields. The open-spacing region is located outside the polygon region, and includes a plurality of sub-resolution polygon and second fields, and does not include any main polygons. The system also includes a nearly on-axis illumination (ONI) to expose the EUV mask and optics to direct diffracted lights reflected from the EUV mask towards the semiconductor wafer.

20 Claims, 6 Drawing Sheets

Exposure Intensity

Exposure Intensity

EXTREME ULTRAVIOLET LITHOGRAPHY PROCESS AND MASK

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As the size of a device feature, such as gate length, has decreased, numerous challenges have risen. High resolution lithography processes are often one of the more important areas to decreasing feature size, and improvements in this area are generally desired. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for semiconductor technology nodes with very small feature sizes, such as 14-nm, and beyond. EUV lithography is very similar to optical lithography in that it uses a mask to print wafers. However, unlike optical lithography, EUV employs light in the EUV region, e.g., at about 13.5 nm. At the wavelength of 13.5 nm, most materials are highly absorbing. Thus, reflective optics, rather than refractive optics, are commonly used in EUV lithography. Although existing methods of EUV lithography have been generally adequate for their intended purposes, they have not been entirely satisfactory in all respects. For example, challenges rise to non-uniformity of exposure intensity is received by edge patterns. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
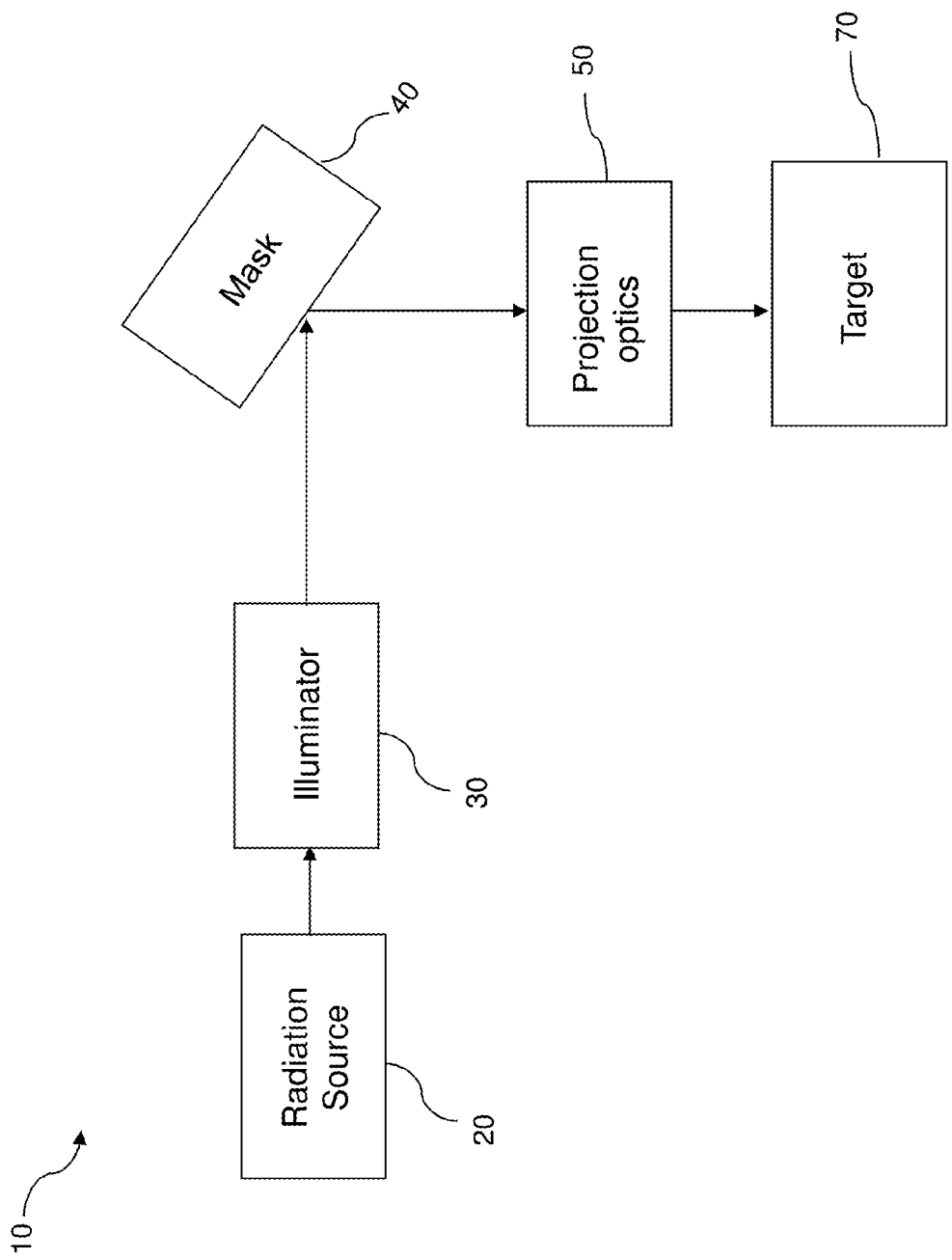
FIG. 1 is a block diagram of a lithography system for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, an EUV lithography system 10 that may benefit from one or more embodiments of the present invention is disclosed. The EUV lithography system 10 employs an EUV radiation source 20 having a wavelength of about 1-100 nm, including an EUV wavelength of about 13.5 nm.

The EUV lithography system 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto the mask 40. In the EUV wavelength range, reflective optics is employed generally. Refractive optics, however, can also be realized by e.g., zoneplates. In the present embodiment, the illuminator 30 is set up to provide a on-axis illumination (ONI) to illuminate the mask 40. In ONI, all incoming light rays incident on the mask at the same angle of incidence (AOI), e.g., AOI=6°, as that of the chief ray. In real situation, there may be some angular spread of the incident light. For example, if a disk illumination (i.e., the shape of the illumination on the pupil plane being like a disk centered at the pupil center) of a small partial coherence σ, e.g., σ=0.3, is employed, the maximum angular deviation from the chief ray is $\sin^{-1}[m \times \sigma \times NA]$, where m and NA are the magnification and numerical aperture, respectively, of the imaging system (i.e., the projection optics box (POB) 50 to be detailed below). Partial coherence σ can also be used to describe a point source which produces a plane wave illuminating the mask 40. In this case, the distance from the pupil center to the point source in the pupil plane is $NA \times \sigma$ and the AOI of the corresponding plane wave incident on the mask 40 is $\sin^{-1}[m \times \sigma \times NA]$. In the present embodiment, it is sufficient to employ a nearly ONI consists of point sources with σ less than 0.3.

Figure 2:
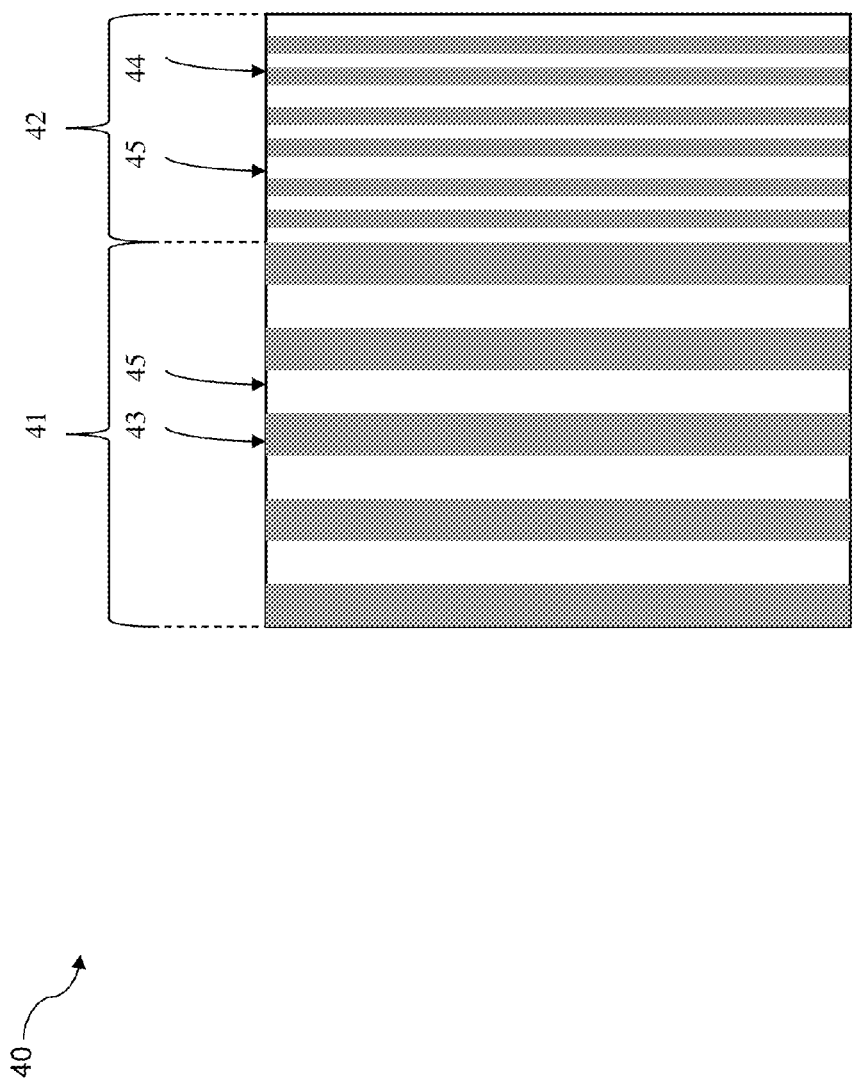
FIG. 2 is a top schematic view of patterns in an EUV mask in accordance with some embodiments.

Referring to FIGS. 1, and 2, the EUV lithography system 10 also employs a mask 40 (in the present disclosure, the terms mask, photomask, and reticle are used to refer to the same item). The mask 40 can be a transmissive mask or a reflective mask. In the present embodiment, the mask 40 has a first region 41 and a second region 42. The second region 42 is an area beside the first regions 41, including an edge of a component or a device. The first region 41 has polygons 43. The polygons are used for circuit pattern. The second region 42 has sub-resolution polygons 44. The sub-resolution technique employs optical proximity correction (OPC) assistant features, which have dimensions under the resolution of the lithography process. These sub-resolution OPC features (referred to as sub-resolution polygons) will not be imaged on a final target, such as a semiconductor wafer. The mask 40 also has a field 45. The field 45 provides a background region on the mask 40 without polygons and sub-resolution polygons. In one embodiment, both of the first and the second regions, 41 and 42 have sub-resolution polygons.

In the present embodiment, a sub-resolution polygon area ratio is set to be close to a polygon area ratio of the first region 41. The polygon ratio of a region is a ratio of an area of all polygons in the region to an area of the region. The mask 40 may incorporate other resolution enhancement techniques such as phase-shifting mask (PSM) and/or optical proximity correction (OPC). The mask 40 will be described later.

Referring also to FIG. 1, the EUV lithography system 10 also employs a projection optics box (POB) 50. The POB 50 may have refractive optics or reflective optics. The radiation reflected from the mask 40 (e.g., a patterned radiation) is collected by the POB 50. The POB 50 also includes a pupil filter placed at an optics pupil plane to controlling the light intensity distribution reflected from the mask 40. The pupil filter has a plurality of light-transmitting regions to transmit light reflected from the mask 40 to a substrate, such as a wafer, and a plurality of opaque regions to block light reflected from the mask 40 thereby from transmitting through. In the present embodiment, the pupil filter removes more than 70% of the non-diffracted lights to achieve doubling spatial frequency resolution.

Figure 3:
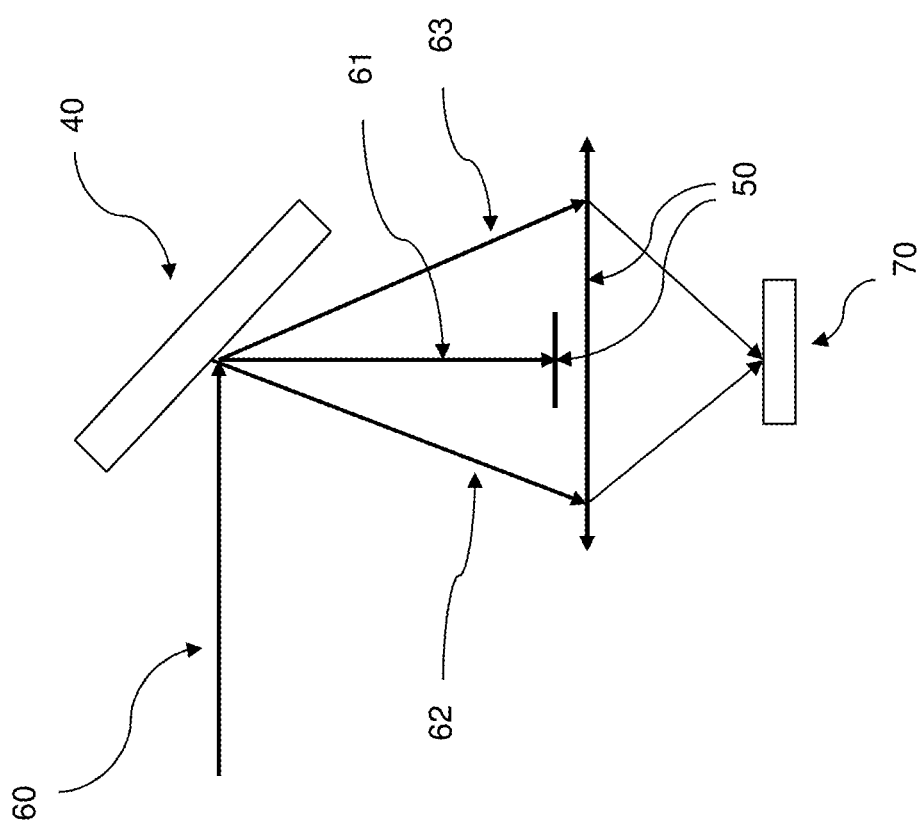
FIG. 3 is a diagrammatic perspective view of a projection optics box (POB) employed in the lithography process for implementing one or more embodiments in accordance with some embodiments

Referring to FIG. 3, an incident light ray 60, after being reflected from the mask 40, is diffracted into various diffraction orders due to presence of these mask patterns, such as a 0-th diffraction order ray 61, a −1-st diffraction order ray 62 and a +1-st diffraction order ray 63. For lithographic imaging, purely coherent illumination is generally not employed. Disk illumination with partial coherence σ being at most 0.3 generated by the illuminator 30 is employed. In the present embodiment, the non-diffracted light rays 61 are mostly (e.g., more than 70%) removed by the pupil filter, e.g., a central opaque region in the pupil plane and it results in doubling the spatial frequency resolution on a target 70. The −1-st and +1-st diffraction order rays, 62 and 63, are collected by the POB 50 and directed to expose the target 70.

Referring again to FIG. 1, the target 70 includes a semiconductor wafer with a photosensitive layer (e.g., photoresist or resist), which is sensitive to the EUV radiation. The target 70 may be held by a target substrate stage. The target substrate stage provides control of the target substrate position such that the image of the mask is scanned onto the target substrate in a repetitive fashion (though other lithography methods are possible).

The following description refers to the mask 40 and a mask fabrication process. The mask fabrication process includes two steps: a mask substrate fabrication process and a mask patterning process. During the mask substrate fabrication process, a mask substrate is formed by depositing suitable layers (e.g., multiple reflective layers) on a suitable substrate. The mask substrate is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

In general, various masks are fabricated for being used in various processes. Types of EUV masks include binary intensity mask (BIM) and phase-shifting mask (PSM). An example BIM includes an almost totally absorptive region (also referring to as an opaque region) and a reflective region. In the opaque region, an absorber is present and an incident light beam is almost fully absorbed by the absorber. The absorber can be made of materials containing chromium, chromium oxide, chromium nitride, aluminum-copper, titanium, titanium nitride, tantalum, tantalum oxide, tantalum nitride, and tantalum boron nitride. In the reflective region, the absorber is removed and the incident light is reflected by a multilayer (ML), which will be described in further detail below. A PSM includes an absorptive region and a reflective region. A portion of the incident light reflects from the absorptive region with a proper phase difference with respect to a light reflected from the reflective region to enhance the resolution and imaging quality. The absorber of the PSM can be made by materials such as tantalum nitride and tantalum boron nitride at a specific thickness. The PSM can be attenuated PSM (AttPSM) or alternating PSM (AltPSM). An AttPSM usually has 2%-15% of reflectivity from its absorber, while an AltPSM usually has larger than 50% of reflectivity from its absorber.

Figure 4:
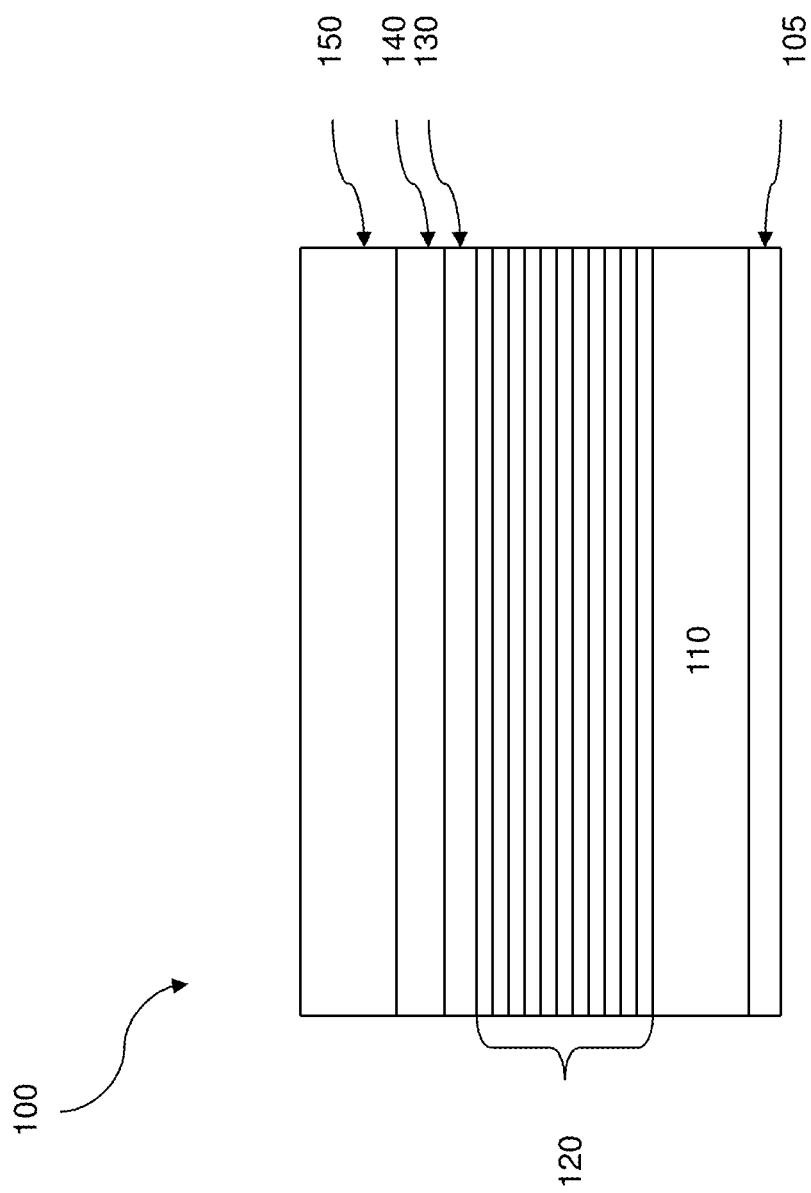
FIG. 4 is a diagrammatic cross-sectional of a blank mask at various stages of a lithography process constructed in accordance with some embodiments.

Referring to FIG. 4, a EUV mask substrate 100 comprises a material layer 110 made of low thermal expansion material (LTEM). The LTEM may include $TiO_2$ doped $SiO_2$, and/or other low thermal expansion materials known in the art. The LTEM layer 110 serves to minimize image distortion due to mask heating. In the present embodiment, the LTEM layer 110 includes materials with a low defect level and a smooth surface. In addition, a conductive layer 105 may be deposited under (as shown in the figure) the LTEM layer substrate 110 for the electrostatic chucking purpose. In one embodiment, the conductive layer 105 includes chromium nitride (CrN), though other compositions are possible.

A reflective multilayer (ML) 120 is deposited over the LTEM layer 110. According to Fresnel equations, light reflection will occur when light propagates across the interface between two materials of different refractive indices. The reflected light is larger when the difference of refractive indices is larger. To increase the reflected light, one may also increase the number of interfaces by depositing a multilayer of alternating materials and let lights reflected from different interfaces interfere constructively by choosing appropriate thickness for each layer inside the multilayer. However, the absorption of the employed materials for the multilayer limits the highest reflectivity that can be achieved. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any material that is highly reflective at EUV wavelengths can be utilized for the ML 120. The thickness of each layer of the ML 120 depends on the EUV wavelength and the incident angle. The thickness of the ML 120 is adjusted to achieve a maximum constructive interference of the EUV light reflected at each interface and a minimum absorption of the EUV light by the ML 120. The ML 120 may be selected such that it provides a high reflectivity to a selected radiation type/wavelength. A typical number of film pairs is 20-80, however any number of film pairs is possible. In an embodiment, the ML 120 includes forty pairs of layers of Mo/Si. Each Mo/Si film pair has a thickness of about 7 nm, with a total thickness of 280 nm. In this case, a reflectivity of about 70% is achieved.

A capping layer 130 is formed above the ML 120 to prevent oxidation of the ML. In the present embodiment, the capping layer 130 includes silicon with about 4-7 nm thickness. A buffer layer 140 is formed above the capping layer 130 to act as an etching stop layer in a patterning or repairing process of an absorption layer, which will be described later. The buffer layer 140 has different etching characteristics from the absorption layer. The buffer layer 140 includes ruthenium (Ru), Ru compounds such as RuB, RuSi, chromium (Cr), Cr oxide, and Cr nitride. A low temperature deposition process is often chosen for the buffer layer to prevent inter-diffusion of the ML 120. In one embodiment, the capping layer and the buffer layer is a single layer.

An absorption layer 150 is formed above the buffer layer 140. The absorption layer 150 preferably absorbs radiation in the EUV wavelength range projected onto a patterned EUV mask 200. The absorption layer 150 includes multiple film layers from a group of chromium, chromium oxide, titanium nitride, tantalum nitride, tantalum, titanium, aluminum-copper, palladium, tantalum boron nitride, aluminum oxide, molybdenum (Mo), or other suitable materials. With a proper configuration of multiple film layers, the absorption layer 150 will provide process flexibility in a subsequent etching process by different etch characteristics of each film.

One or more of the layers 105, 120, 130, 140 and 150 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Figure 5:
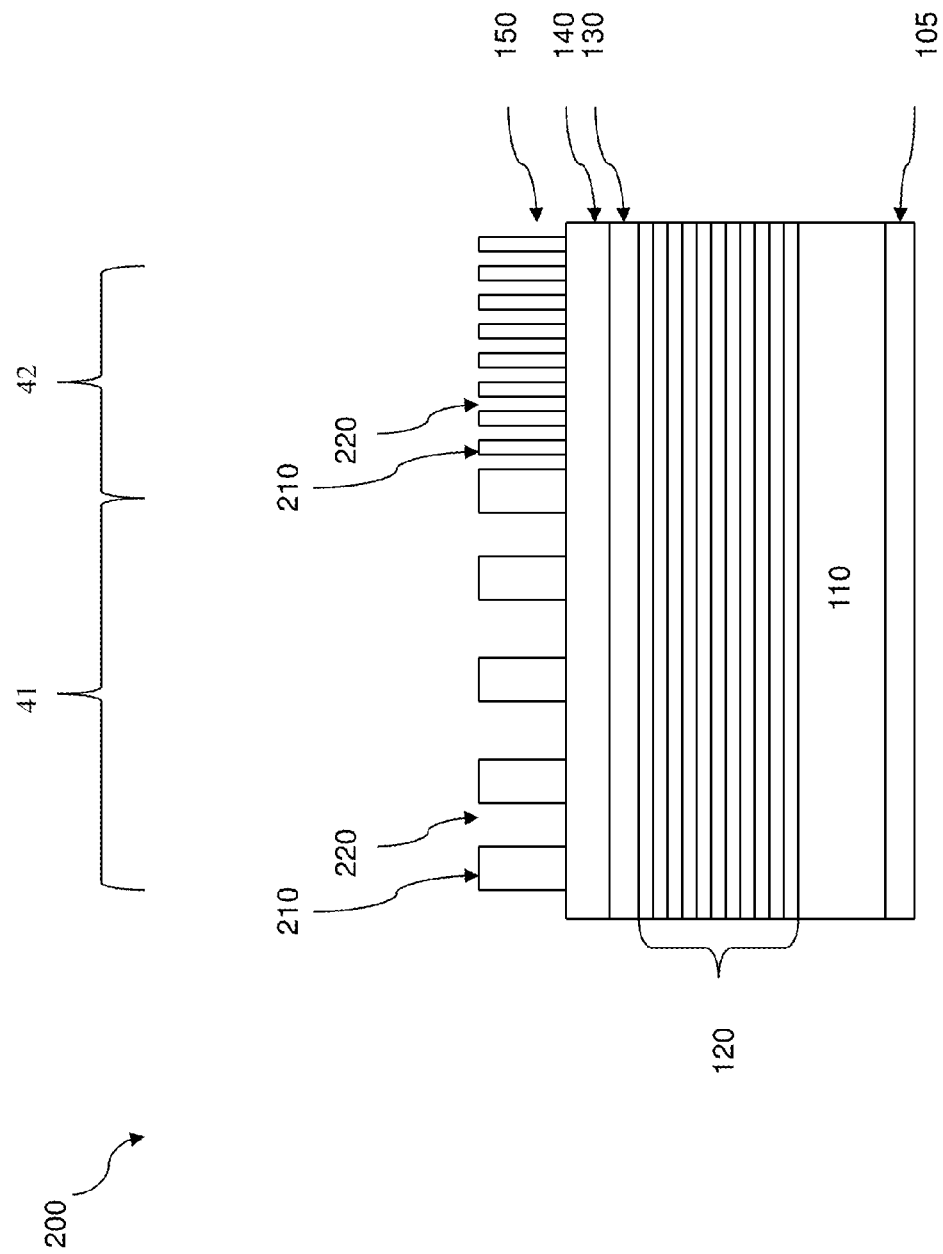
FIG. 5 is a diagrammatic cross-sectional view of various aspects of one embodiment of an EUV mask at various stages of a lithography process in accordance with some embodiments.

Referring to FIG. 5, the absorption layer 150 is patterned to form the design layout pattern EUV mask 200 having a first state 210 and a second state 220. In the first state 210, the absorption layer 150 remains while in the second state of 220, it is removed. The absorption layer 150 can be patterned by various patterning techniques. One such technique includes using a resist coating (e.g., spin-on coating), soft baking, mask aligning, exposure, post-exposure baking, developing the resist, rinsing, and drying (e.g., hard baking). An etching process is followed to remove the absorption layer 140 in the second region 220. The etching process may include dry (plasma) etching, wet etching, and/or other etching methods. For example, the dry etching process may implement a fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. Alternative patterning processes include maskless photolithography, electron-beam writing, direct-writing, and/or ion-beam writing.

In one embodiment, the first state 210 is assigned to the polygons 43 in the first region 41 and sub-resolution polygons 44 in the second region 42, while the second state 220 is assigned to the field 45 in both of the first and the second regions, 41 and 42. In another embodiment, the second state 220 is assigned to the polygons 43 and sub-resolution polygons 44, while the first state 210 is assigned to the field 45.

Figure 6B:
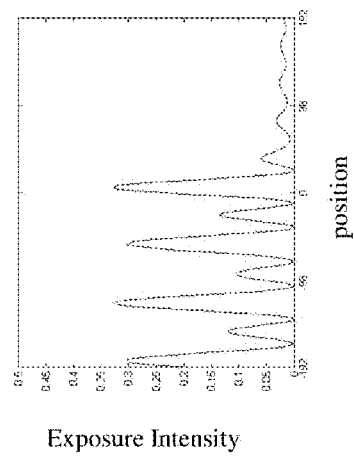
FIGS. 6A through 6D are diagrammatical views of various exposing intensity profiles during a lithography exposure process in accordance with some embodiments.
Figure 6D:
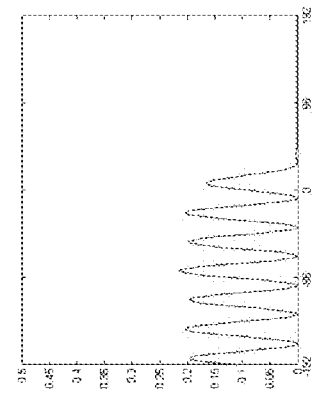
Figure 6A:
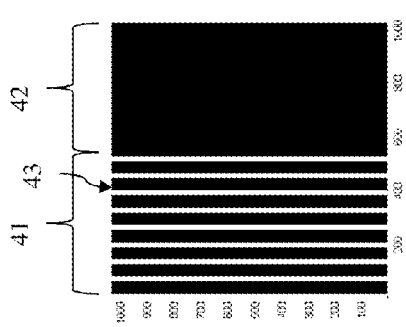
Figure 6C:
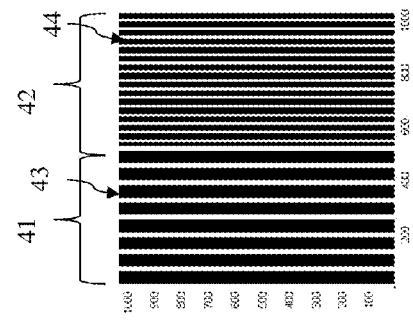

Referring to FIGS. 6A and 6B, without filling in the second region 42 with sub-resolution polygons 44, the polygons 43 locate at close to an edge of the first region 41 may experience a non-uniform exposure intensity crossing them. FIG. 6B is a chart of exposure intensity vs. polygons locate close to an edge, without sub-resolution polygons 44 and a non-uniform exposure intensity crossing those polygons is observed. On the other hand, by filling in the second region 42 with sub-resolution polygons 44, a portion reflected light from the polygons 43 at an edge of the first region 41 interferes with a portion of reflected light from the sub-resolution polygons 44 in the second region 42 and results in an uniform intensity of reflected light crossing polygons at the edge of the first region 41, as shown in FIGS. 6C and 6D.

Based on the above, it can be seen that the present disclosure offers the EUV lithography system 10. The EUV lithography system 10 employs a nearly ONI, e.g., a disk illumination with partial coherence σ smaller than 0.3 to expose an EUV mask to produce diffracted lights and non-diffracted lights. The EUV lithography system 10 also employs a spatial filter to remove more than 70% of the non-diffracted lights to achieve doubling spatial frequency resolution. The EUV lithography system 10 also employs an EUV mask having sub-resolution polygons to fill in a region (where there is no polygons) with a predetermined polygon area ratio. The EUV lithography system 10 demonstrates an enhancement of aerial image fidelity of patterns located close to end of the polygon region. The EUV lithography system 10 provides a resolution enhancement technique for future nodes.

The present disclosure is directed towards lithography systems and processes. In one embodiment, an EUVL system includes an extreme ultraviolet (EUV) mask with a first and a second states. The EUV mask includes a first region having main polygons and a second region adjacent to the first region, which has no main polygon. The second region also has sub-resolution polygons. The system also includes a nearly on-axis illumination (ONI) with partial coherence σ less than 0.3 to expose the EUV mask to produce diffracted light and non-diffracted light. The system also includes a filter to remove most of the non-diffracted light and optics to collect and direct the diffracted light and not removed non-diffracted light to expose a target.

In another embodiment, an extreme ultraviolet lithography (EUVL) process includes receiving an extreme ultraviolet (EUV) mask. The EUV mask has a first state and a second state. The EUV mask also includes a first region having main polygons and a second region, adjacent to the first region, having sub-resolution polygons and having no main polygon. The process also includes exposing the EUV mask with a nearly on-axis illumination (ONI) with partial coherence σ less than 0.3 to produce diffracted light and non-diffracted light, removing most of the non-diffracted light by a filter and collecting and directing the diffracted light and the not removed non-diffracted light by an optics to expose a target.

The present disclosure is also directed towards masks. In one embodiment, an EUV mask includes a first region having main polygons with a first polygon area ratio; and a second region, adjacent to the first region, having sub-resolution polygons with a second polygon area ratio. The second polygon area ratio is close to the first polygon area ratio. The second region has no main polygon The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) system for patterning a semiconductor wafer, comprising:
    an extreme ultraviolet (EUV) mask having a first state and a second state, the EUV mask including:
    a first region, wherein the first region has polygons; and
    a second region adjacent to the first region and wherein the second region has sub-resolution polygons;
    a nearly on-axis illumination (ONI) with partial coherence σ less than 0.3 to expose the EUV mask to produce diffracted light and non-diffracted light; and
    optics to collect and direct the diffracted light to expose a target, wherein the non-diffracted light is removed by a filter.

2. The system of claim 1, wherein the first region has sub-resolution polygons.

3. The system of claim 1, wherein a sub-resolution polygon area ratio of the second region is close to a polygon area ratio of the first region, the polygon area ratio of the first region is a ratio of an area of all polygons in the first region to an area of the first region and the sub-resolution polygon area ratio of the second region is a ratio of an area of all sub-resolution polygons in the second region to an area of the second region.

4. The system of claim 1, wherein the first state is assigned to the polygons and the sub-resolution polygons and the second state is assigned to a field, wherein the field is an area in the first region or the second region and is not covered by polygons or sub-resolution polygons.

5. The system of claim 1, wherein the second state is assigned to the polygons and the sub-resolution polygons and the first state is assigned to a field, wherein the field is an area in the first region or the second region and is not covered by polygons or sub-resolution polygons.

6. The system of claim 1, wherein the first state of the EUV mask is provided by a combination of layers including an absorption layer, a buffer layer, a capping layer, a reflective multilayer (ML), and a low thermal expansion material (LTEM) layer.

7. The system of claim 1, wherein the second state of the EUV mask is provided by a combination of layers including a buffer layer, a capping layer, a reflective multilayer (ML), and a low thermal expansion material (LTEM) layer.

8. The system of claim 2, wherein sub-resolution polygon area ratio of the first region is close to a polygon area ratio of the first region, the polygon area ratio of the first region is a ratio of an area of all polygons in the first region to an area of the first region and the sub-resolution polygon area ratio of the first region is a ratio of an area of all sub-resolution polygons in the first region to the area of the first region.

9. An extreme ultraviolet lithography (EUVL) process, comprising:
    receiving an extreme ultraviolet (EUV) mask having a first and a second state including:
    a first region, wherein the first region has polygons; and
    a second region adjacent to the first region, and wherein the second region has sub-resolution polygons;
    exposing the EUV mask with a nearly on-axis illumination (ONI) with partial coherence σ less than 0.3 to produce diffracted light and non-diffracted light;
    removing most of the non-diffracted light by a filter; and
    collecting and directing the diffracted light by optics to expose a target.

10. The process of claim 9, wherein the first region has sub-resolution polygons.

11. The process of claim 9, wherein the first state of the EUV mask is assigned to the polygons and the sub-resolution polygons and the second state of the EUV mask is assigned a field, wherein the field is an area in the first region or the second region and is not covered by polygons or sub-resolution polygons.

12. The process of claim 9, wherein the second state of the EUV mask is assigned to the polygons and the sub-resolution polygons and the first state of the EUV mask is assigned to a field, wherein the field is an area in the first region or the second region and is not covered by polygons or sub-resolution polygons.

13. The process of claim 9, wherein a polygon area ratio of the second region is set to be close to a polygon area ratio of the first region, wherein the polygon area ratio of a region is a ratio of an area of all polygons in the region to an area of the region.

14. An extreme ultraviolet lithography (EUVL) system for patterning a semiconductor wafer, comprising:
    an extreme ultraviolet (EUV) mask including a first region, wherein the first region has polygons; and
    a second region adjacent to the first region, wherein the second region has sub-resolution polygons;
    an illumination source to direct diffracted light and non-diffracted light towards the EUV mask;
    optics to collect and direct the diffracted light from the EUV mask; and
    a filter to remove at least a portion of the non-diffracted light.

15. The system of claim 14, wherein the first region has sub-resolution polygons.

16. The system of claim 14, wherein the illumination source has a partial coherence σ less than 0.3.

17. The system of claim 14, wherein substantially equal amounts of non-diffracted light are produced from the first and second regions.

18. The system of claim 14, wherein the filter blocks a spatial frequency of the non-diffracted light from the first and second regions.

19. The system of claim 15, wherein a sub-resolution polygon area ratios of the first region and second region are substantially the same.

20. The system of claim 1, wherein substantially equal amounts of non-diffracted light are produced from the first and second regions.

* * * * *